(12) United States Patent
Takeda

(10) Patent No.: US 9,136,210 B2
(45) Date of Patent: Sep. 15, 2015

(54) INTERPOSER AND SEMICONDUCTOR DEVICE

(75) Inventor: Tsutomu Takeda, Tokyo (JP)

(73) Assignee: NEC CORPORATION, Tokyo (JP)

(*) Notice: Subject to any disclaimer, the term of this patent is extended or adjusted under 35 U.S.C. 154(b) by 133 days.

(21) Appl. No.: 13/310,896

(22) Filed: Dec. 5, 2011

(65) Prior Publication Data

US 2012/0139010 A1    Jun. 7, 2012

(30) Foreign Application Priority Data

Dec. 3, 2010    (JP) ................. P2010-270079

(51) Int. Cl.
*H01L 23/498* (2006.01)
*H01L 23/13* (2006.01)
*H01L 29/06* (2006.01)

(52) U.S. Cl.
CPC .......... *H01L 23/49811* (2013.01); *H01L 23/13* (2013.01); *H01L 23/49822* (2013.01); *H01L 23/49827* (2013.01); *H01L 23/49833* (2013.01); *H01L 29/0657* (2013.01); *H01L 2224/16225* (2013.01); *H01L 2224/16227* (2013.01); *H01L 2924/1515* (2013.01); *H01L 2924/15311* (2013.01)

(58) Field of Classification Search
CPC .............. H01L 23/13; H01L 23/49811; H01L 23/49822; H01L 23/49827; H01L 23/49833; H01L 2924/15311; H01L 29/0657; H01L 2224/16227; H01L 2924/1515; H01L 29/772; H01L 23/498
USPC ................... 257/213, 621, E29.242, E23.068
See application file for complete search history.

(56) References Cited

U.S. PATENT DOCUMENTS

| | | | | |
|---|---|---|---|---|
| 7,999,197 | B1* | 8/2011 | Sawyer et al. ................. | 174/522 |
| 2003/0047798 | A1* | 3/2003 | Halahan ........................ | 257/685 |
| 2005/0136634 | A1* | 6/2005 | Savastiouk et al. ........... | 438/597 |
| 2008/0277150 | A1* | 11/2008 | Takashima et al. ........... | 174/260 |
| 2009/0115049 | A1* | 5/2009 | Shiraishi et al. .............. | 257/698 |
| 2010/0230801 | A1* | 9/2010 | Yui ............................... | 257/692 |

FOREIGN PATENT DOCUMENTS

| | | |
|---|---|---|
| JP | 2003-229672 A | 8/2003 |
| JP | 2004-241583 A | 8/2004 |
| JP | 2007-067215 A | 3/2007 |
| JP | 2009059822 A | 3/2009 |
| JP | 2009-277895 A | 11/2009 |

OTHER PUBLICATIONS

Japanese Office Action for JP Application No. 2010-270079 mailed on Sep. 30, 2014 with English Translation.

* cited by examiner

*Primary Examiner* — Asok K Sarkar
*Assistant Examiner* — Dmitriy Yemelyanov
(74) *Attorney, Agent, or Firm* — Sughrue Mion, PLLC

(57) ABSTRACT

An interposer includes a substrate includes a plurality of penetrating electrodes, and a wiring portion formed on the substrate, in which the wiring portion includes a wiring layer electrically connected to the penetrating electrodes and an insulating layer covering the wiring layer. The interposer includes a plurality of first UBM structures provided at a side opposite the substrate of the wiring portion, in which the first UBM structures are electrically connected to the wiring layer. The interposer includes a plurality of bumps provided at the side opposite the wiring portion of the substrate, in which the plurality of bumps is electrically connected to each of the penetrating electrodes via a plurality of second UBM structures.

8 Claims, 12 Drawing Sheets

INTERPOSER AND SEMICONDUCTOR DEVICE

INCORPORATION BY REFERENCE

Priority is claimed on Japanese Patent Application No. 2010-270079, filed Dec. 3, 2010, the content of which is incorporated herein by reference.

BACKGROUND OF THE INVENTION

1. Field of the Invention

The present invention relates to an interposer on which discrete parts such as capacitors are mounted, and to a semiconductor device including the interposer.

2. Description of Related Art

Power supply noise is generated in electronic parts such as a CPU and a clock driver. To reduce the power supply noise, generally, capacitors are employed.

When the frequency of the power noise becomes higher, the capacitors need to be mounted closer to the electronic parts. However, such locations for mounting the capacitors are limited to peripheral rooms of the electronic parts or the back side of an electronic part 104 mounted on an interposer 101 as shown in FIG. 12. Therefore, it is impossible for a capacitor 103 to be placed any closer to the electronic part 104.

Further, as shown in FIG. 13, a cavity is formed from the back surface of the interposer 101 or the print wiring board to the middle of the wiring layer, and a cavity portion :102 is mounted with the capacitor 103. This structure is proposed so that the capacitor 103 can be disposed at a position closer than the electronic part 104. However, with this structure, the wiring path where the cavity is formed across the wiring layers is broken. As a result, the capability of power supply is reduced, and the wiring arrangement of signal lines is degraded.

Furthermore, for example, Japanese Patent Application Publication No. 2009-59822 describes that a high dielectric material is sandwiched between a power supply layer and a ground layer of an interposer or a print wiring board to form a capacitor sheet in it. However, this capacitor sheet has a small capacitance compared to that of general capacitors, so that there is a problem in that the power supply noise cannot be reduced sufficiently.

SUMMARY OF THE INVENTION

The present invention has been made to solve the issues described above, and provides an interposer that can provide sufficient power supply paths. The interposer makes it possible for a mounting electronic part such as a capacitor or the like to be mounted near the mounting surface of an electronic part (electronic part mounting surface). An object of the present invention is to provide an interposer and a semiconductor device having the interposer which can effectively reduce the power supply noise of the mounted electronic part regardless of the frequency of the noise.

In order to achieve the object above, the present invention includes the configurations below.

An interposer includes a substrate configured to include a plurality of penetrating electrodes, and a wiring portion configured to be formed on the substrate, in which the wiring portion is configured to include a wiring layer electrically connected to the penetrating electrodes and an insulating layer covering the wiring layer. The interposer includes a plurality of first UBM structures provided at a side opposite the substrate of the wiring portion, in which the first UBM structures are electrically connected to the wiring layer. The interposer includes a plurality of bumps provided at the side opposite the wiring portion of the substrate, in which the plurality of bumps is electrically connected to each of the penetrating electrodes via a plurality of second UBM structures. In this case, the first UBM structures are connected to connecting portions of a mounting electronic part to mount the mounting electronic part, each of the bumps is connected to electrode pads of a wiring substrate so that the interposer is mounted on the wiring substrate, a cavity portion is formed to provide an opening at an opposite surface to the wiring portion of the substrate, the wiring layer is exposed at a bottom of the cavity portion, and the wiring layer includes pad portions at an exposed portion of the bottom of the cavity portion so that the pad portions are connected to the mounting electronic part.

A semiconductor device in accordance with the present invention includes the interposer of the present invention, an electronic part having multiple connection parts and a wiring substrate having multiple electrode pads, in which the electronic part is mounted on the interposer by connecting the each of the connection parts with each of the first UBM structures of the interposer, and the wiring substrate mounts the interposer by connecting each of the electrode pads with each bump of the interposer.

According to the present invention, it is possible for the interposer to mown a mounting electronic part closely on an electronic part mounting surface (the surface on which the first UBM structure is formed).

Thereby, when the mounting electronic part is a capacitor, the high frequency power supply noise generated by the mounted electronic part is effectively reduced by the capacitor, so that a high noise immunity can be achieved.

In another case, when the mounting electronic part is a resistor part, the transmission characteristics of a series termination circuit can be improved.

Furthermore, when the mounting electronic part is connected to the wiring substrate that mounts the interposer, the wirings formed on the wiring substrate side can be used as a power supply path, so that it is allowed to obtain the power supply path equivalent to an interposer that does not form a cavity part.

In another case, according to the present invention, as the semiconductor device is provided with the interposer of the present invention, the high frequency power supply noise generated by the mounting electronic part mounted on the interposer can be reduced effectively, and the transmission characteristics of the series termination circuit can be improved. Thereby, the semiconductor device can achieve stable and good operation.

DETAILED DESCRIPTION OF THE INVENTION

Next, a description will be given of an embodiment in accordance with the present invention with reference to figures.

(First Embodiment)

Next, a description is given of an interposer in accordance with the first embodiment of the present invention.

Figure 1:
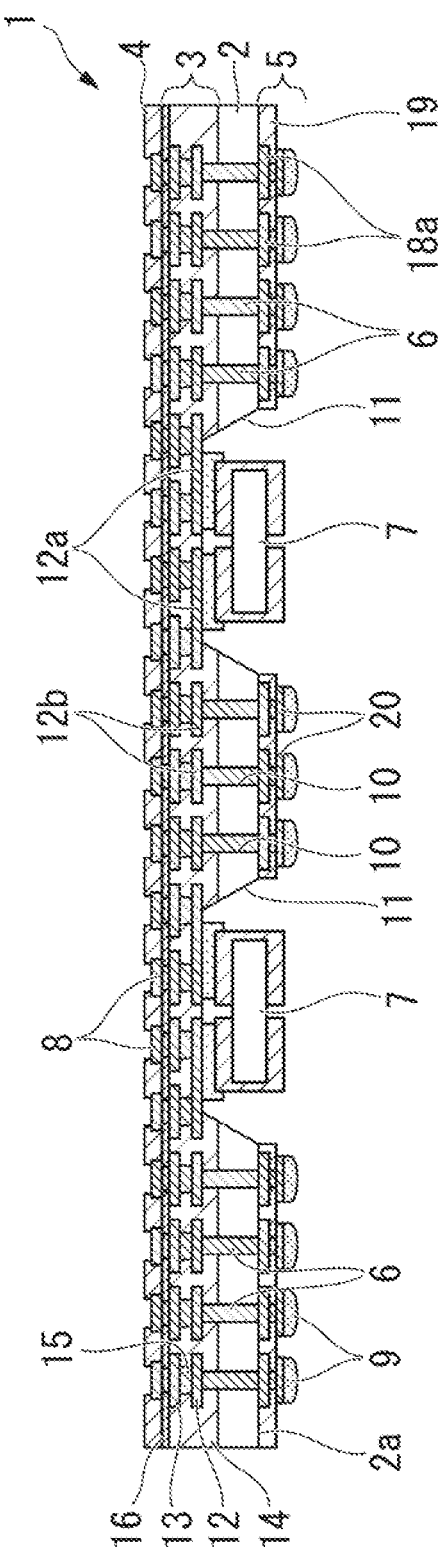
FIG. 1 is a schematic diagram that illustrates a longitudinal cross-section of an interposer in accordance with a first embodiment of the present invention.

FIG. 1 is a schematic diagram that illustrates a longitudinal cross-section of an interposer 1 in accordance with a first embodiment of the present invention.

Figure 2:
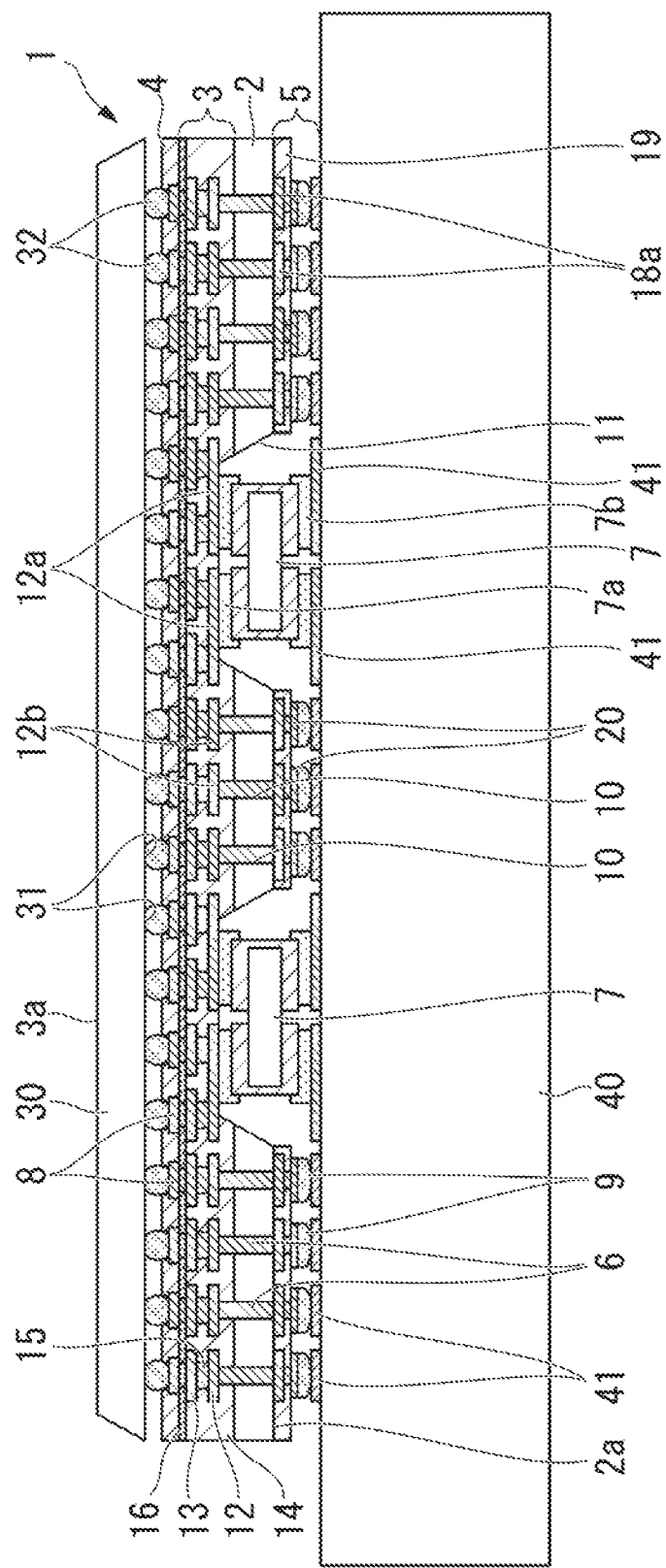
FIG. 2 is a schematic diagram that illustrates a longitudinal cross-section of the interposer, in which an electronic part is mounted on the interposer and the interposer is mounted on a wiring substrate.

FIG. 2 is a schematic diagram that illustrates a longitudinal cross-section of the interposer 1, in which an electronic part 30 is mounted on an interposer 1 and the interposer 1 is mounted on a wiring substrate 3.

The interposer 1 indicated in FIG. 1 includes a silicon substrate 2, a multilayer wiring portion 3, and an encapsulant resin 4 formed on one side surface of the silicon substrate 2, a bump forming portion 5 provided on another side surface of the silicon substrate 2, penetrating electrodes 6 that penetrate the silicon substrate 2 in the thickness direction, and capacitors (electronic parts for mounting) 7 provided in a cavity 11 of the silicon substrate 2. As shown in FIG. 2, with respect to the interposer 1, each first UBM structure 8 is formed on the multilayer wiring portion 3 to which each connection portion 31 of the electronic part (mounting electronic part) 30 is electrically connected via a bump 32. In this way, the electronic part 30 is mounted on the interposer 1. Furthermore, each bump 9 of the bump forming portion 5 is electrically connected to a respective pad portion 41b of the wiring substrate 40, so that the interposer 1 is mounted to the wiring substrate 40.

In this case, "UBM" is an abbreviated expression for "Under Bump Metallization" or "Under Barrier Metal."

The silicon substrate 2 is used to support each of portions of the interposer 1. The silicon substrate 2 includes multiple penetrating holes 10 penetrating the silicon substrate 2 in the thickness direction, and includes multiple cavities 11. Each of the penetrating holes 10 is formed with a separation that is the same as the separation of the pad portions 41b formed on the wiring substrate 40.

The wiring substrate 3 includes a first wiring layer 12, a second wiring layer 13, an interlayer insulating layer 14, via electrodes 15, and a passivation layer 16.

The first wiring layer 12 is formed with a predetermined pattern on the silicon substrate 2. The second wiring layer 13 is formed on the first wiring layer 12 with a predetermined pattern. In the present invention, the first wiring layer 12 includes pad-portions 12a formed on areas which correspond to the cavity portions 11, in which the pad portions 12a are electrically connected to the capacitors 7. The pad portions 12a are electrically connected to the first UBM structures 8 via the first wiring layer 12, the via electrodes 15, and the second wiring layer 13, where the first UBM structures 8 respectively correspond to pins (power supply connections) and ground pins (ground connections) of the electronic part 30. Therefore, with reference to the interposer 1, the capacitors 7 are connected to the pad portions 12a with the electronic part 30 being mounted on the interposer 1. The capacitors 7 are electrically connected to the power supply pins and ground pins via each of the above parts. In descriptions below, other pads excluding the pad portions 12a of the first wiring layer 12 will be referred to as wiring 12.

Materials are not specifically limited for forming the first wiring layer 12 and the second wiring layer 13. As an example, conductive metal materials such as Cu or the like can be used.

The interlayer insulating layer (insulating layer) 14 is formed between the silicon substrate 12 and the first wiring layer 12 and between the first wiring layer 12 and the second wiring layer 13 so that the interlayer insulating layer 14 fills each of spaces between the wiring layers. The interlayer insulating layer 14 is made of an insulating material such as $SiO_2$ or the like, and provides insulation among the silicon substrate 12, each of the wiring layers 12 and 13, and the via electrodes 15.

In this case, each of the penetrating holes 10 and each of the cavity portions 11, which are formed in the silicon substrate 2, are continuously formed through the interlayer insulating layer 14 that is positioned between the silicon substrate 2 and the first wiring layer 12. The top end of each penetrating hole 10 exposes the bottom surface of the wiring portion 12b of the first wiring layer 12. The top end of each cavity portion 11 exposes the bottom of each pad portion 12a of the first wiring layer 12. Each capacitor 7 mounted in the cavity portion 11 is electrically connected to each of the pad portions 12a exposed at the top of the cavity portions 11.

A number of via electrodes 15 are formed to penetrate in the thickness direction of the interlayer insulating layer 14 that is located between the first wiring layer 12 and the second wiring layer 13. The via electrodes 15 electrically connect between the first wiring layer 12 and the second wiring layer 13. Although the material of the via electrodes 15 is not limited, it is preferable that the metal formed by electroplating be of lower resistivity. For example, Cu is a preferable material.

The passivation layer 16 is formed to cover the top surfaces of the interlayer insulating layer 14 and the second wiring layer 13. A number of openings exposing the top surface of the second wiring layer 13 are formed with separations that correspond to the separations of respective connecting portions 31 of the electronic part 30 to be mounted on the interposer 1. The passivation layer 16 is formed to protect the surfaces of the interlayer insulating layer 14 and the second wiring layer 13 from external damage.

Materials are not specifically limited for forming the passivation layer 16. It is possible to use any of films which are employed in semiconductor manufacturing as passivation layers, such as a polyimide film, PSG (Phospho-Silicate-Grass) film, silicon nitride film or the like.

The surface of the multilayer wiring portion 3 is covered with the encapsulant resin 4 except for part of the top surfaces of the first UBM structures 8.

The encapsulant resin 4 is formed to protect the multilayer wiring portion 3 from external damage. For example, an epoxy-based resin can be used for the encapsulant resin 4. In this case, with regard to the interposer 1, the top surface of the encapsulant resin 4 and the surface of the first UBM structures 8 form an electronic part mounting surface 3a which faces the back surface of the electronic part 30.

On the multilayer wiring portion 3, the first UBM structures 8 are formed to respectively correspond to the second wiring layer 13.

Figure 3:
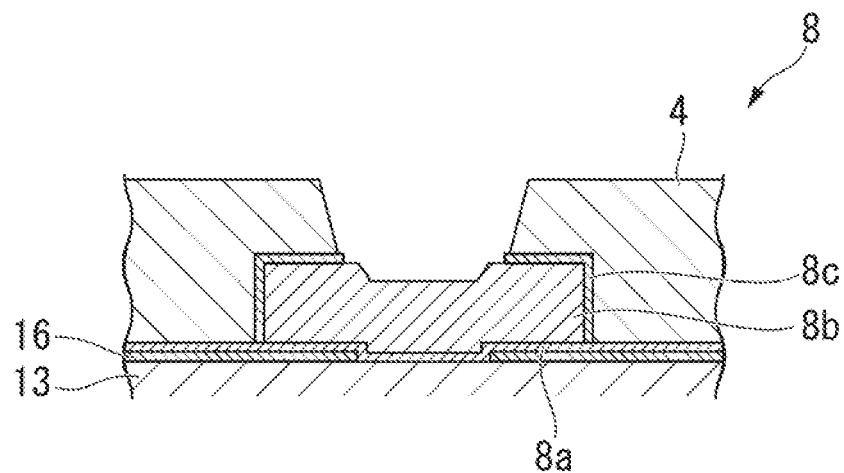
FIG. 3 is a schematic diagram that illustrates an enlarged cross-section of a first UBM structure in accordance with the first embodiment of the present invention.

As shown in an enlarged cross-sectional diagram of FIG. 3, each of the first UBM structures 8 is formed of an underlying plating 8a that covers the second wiring layer 13 exposed from the opening of the passivation layer 16, a conductive portion 8b made from Ni/Au the like provided on the underlying plating 8a, and a metallic film 8c covering the conductive portion 8b, all of which are covered with the encapsulant resin 4. Furthermore, part of the top surface of the conductive portion 8b is exposed from the metallic film 8c and the encapsulant resin 4.

The first UBM structures 8 are respectively connected to the connecting portions 31 of the electronic part 30 via solder bumps 32, in which the electronic part 30 is mounted on the interposer 1.

A thermal oxide ($SiO_2$ film), which is not indicated in the figure, and a barrier layer are formed on the whole area of the back surface (the surface opposite the multiple wiring portion 3) of the silicon substrate 2 and the inside of each of the penetrating holes 10 and the inside of each of the cavity portions 11. Via each of the films above, the back surface 2a of the silicon substrate is provided with a bump forming portion 5. Each of the penetrating holes 10 is filled with a conductive body. The conductive body filled in each of the penetrating holes 10 forms a penetrating electrode 6 which connects the first wiring layer 12 with the bump forming portion 5.

The thermal oxide film functions as an insulating film for insulating between the silicon substrate 2 and each of the penetrating electrodes 6, and for insulating between the bump forming portions 5 of the silicon substrate 2 and each of conductive films 18a. Furthermore, the barrier layer has a function that prevents Cu diffusing from each penetrating electrode 6 and each conductive film 18a to the thermal oxide film and silicon.

The bump forming portion 5 includes the conductive films 18a and an insulating film 19.

A number of the conductive films 18a are formed on the barrier layer of the back surface 2a of the silicon substrate 2 to correspond to each of the penetrating electrodes 6. Respective conductive films 18a are electrically connected to each of the penetrating electrodes.

Furthermore, the insulating film 19 is formed to cover each of the conductive films 18a. The insulating layer 19 is made from insulating material, which has a function that protects each of the conductive films 18a from the external environment.

The bump forming portion 5 includes the second UBM structures 20 and bumps 9.

The second UBM structures 20 are respectively formed on each of the conductive films 18a, and adhere to both of the conductive films 18a and the bumps 9.

Figure 4:
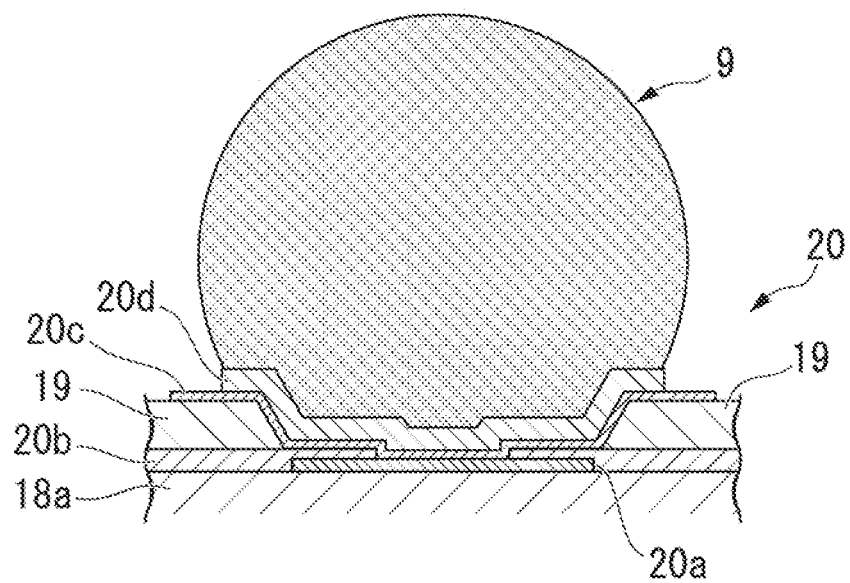
FIG. 4 is a schematic diagram that illustrates an enlarged cross-section of a second UBM structure in accordance with the first embodiment of the present invention.

As shown in FIG. 4, the second UBM structures 20 are formed of a metallic layer 20a, a passivation layer 20b, an insulating layer 19, an underlying plating layer 20c, and a conductive portion 20d.

The metallic layer 20a is formed on the conductive film 18a.

The passivation layer 20b covers the metallic layer 20a and the conductive film 18a so that the top surface of the metallic layer 20a is exposed.

The insulating layer 19 covers the passivation layer 20b so that the top surface of the metallic layer 20a exposed from the passivation layer 20b and a peripheral portion of the top surface of the metallic layer 20a are exposed.

The underlying plating 20c covers the metallic layer 20a exposed from the insulating layer 19 and the passivation layer 20b. The underlying plating 20c covers the peripheral portions of the metallic layer 20a and the insulating layer 19.

The conductive portion 20d is made of Ni/Au or the like, and formed on the underlying plating 20c.

The bump 9 is a conductive terminal with a round shape, and formed of a low melting point metal such as solder. The bump 9 is provided on each of the second UBM structures 20 (e.g., on the conductive portion 20d). The interposer 1 is mounted on the wiring substrate 40 by connecting each bump 9 with each pad portion 41b of the wiring substrate 40.

Furthermore, with respect to the interposer 1 in accordance with the present invention, capacitors 7 are respectively provided in each of the cavity portions 11 of the silicon substrate 2. The connecting terminal 7a of the capacitor 7 is electrically connected to the pad portion 12a that is exposed in the cavity portion 11. In accordance with the first embodiment, each capacitor 7 includes a connecting terminal 7a at one side and a connecting terminal 7b at wherein the mark of the intermediate transfer part include at least a first mark and a second mark, and length of each of the first mark and second mark are different from each other in a moving direction of the intermediate transfer part the other side opposite the one side. The connecting terminal 7b is configured to be connectable to the pad portion 41a of the wiring substrate 40.

For the interposer 1, with the electronic part 30 being mounted, each capacitor 7 is electrically connected to a power supply pin and ground pin of the electronic part 30 via respective portions of the multilayer wiring portion 3, in this way, the power supply current can flow through the capacitors 7 from the electronic part 30, and the electric power noise generated by the electronic part 30 can be absorbed in the capacitors 7. Thereby, the electronic part 30 can be operated stably.

Furthermore, each of the capacitors 7 is mounted within the cavity portion 11, and then each of the capacitors 7 can be placed closer to an electronic part mounting surface 3a compared to a case where each capacitor 7 is mounted on the back surface 2a 5 of the silicon substrate 2. For example, the separation between each of the wiring layers 12 and 13 is very narrow, namely, 1 μm. By mounting the capacitor 7 within the cavity portion 11, the separation between the capacitor 7 and the electronic part 30 can be reduced less than a number of micrometers. Thereby, high frequency power supply noise generated by the electronic part 30 is effectively reduced by the capacitor 7, and thus the resistance to the high frequency power supply noise can be improved.

Furthermore, as described in the first embodiment above, when the capacitor 7 is connected to the pad portion 41a of the wiring substrate 40, the wirings of the wiring substrate 40 can be used as a power supply path. This can provide a power supply path equivalent to that of an interposer which does not include the cavity portions 11.

Therefore, the interposer 1 in accordance with the first embodiment can provide sufficient power supply paths with mounting of the capacitors 7 and the electronic part 30 in small separations. In this way, the power supply noise generated by the electronic part 30 can be reduced regardless of frequencies. It thus becomes possible for the electronic part 30 to operate well and stably.

Next, a description will be given of a manufacturing method of the interposer I in accordance with the first embodiment.

FIGS. 5A-5H illustrate a process sequence of the manufacturing method of the interposer 1 indicated in FIG. 1. FIGS. 5A-D show the longitudinal cross-sectional diagram that illustrates the formation processes of multilayer wiring portions and cavity portions. FIGS. 5E-5H show the longitudinal cross-sectional diagram that illustrates the formation processes of penetrating electrodes and conductive films. FIG. 6 is a longitudinal cross-sectional diagram that illustrates a completed interposer.

(1-1) Formation Process of Multilayer Wiring Portions and Encapsulant Resin

Figure 5A:
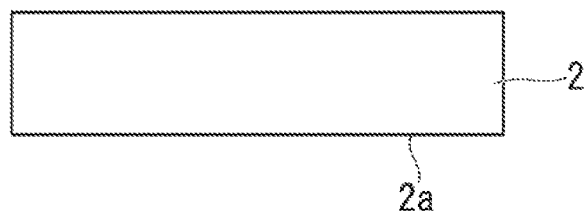
FIGS. 5A-5H are schematic diagrams that illustrate a longitudinal cross-section of the interposer of FIG. 1, in which a sequential formation process of multilayer wiring portions, cavity portions, underlying layers and penetrating electrodes is shown.
Figure 5B:
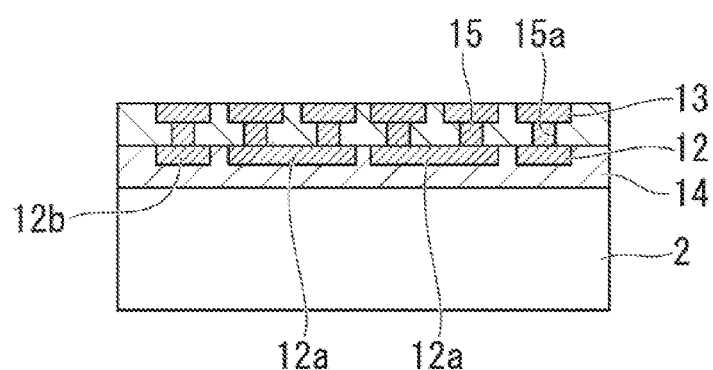
Figure 6:
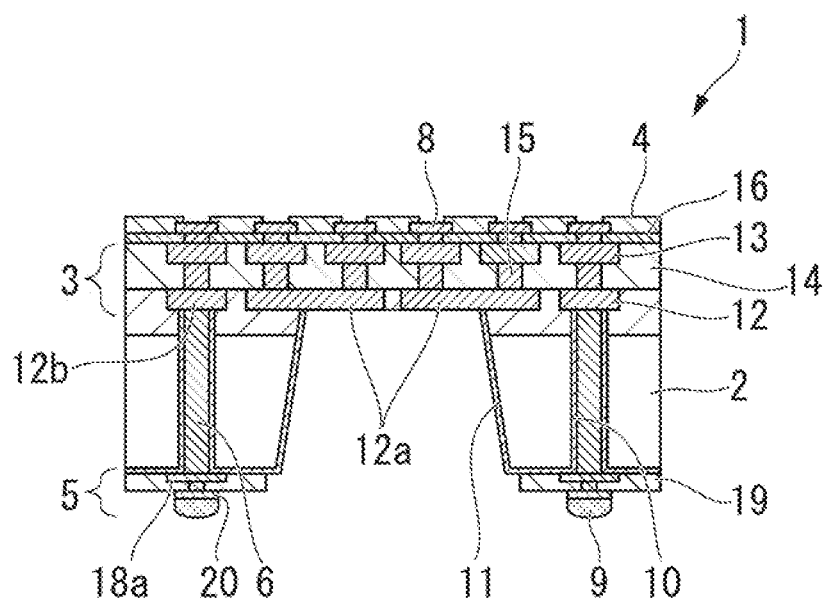
FIG. 6 is a schematic diagram that illustrates a longitudinal cross-section of the formed interposer.

A silicon substrate 2 is provided first, as shown in FIG. 5A. A first wiring layer 12, a second wiring layer 13, an interlayer insulating layer 14, and via electrodes 15 are formed oil the silicon substrate 2, as shown in FIG. 5B.

Each of the wiring layer 12 and the wiring layer 13 can be formed as follows.

(1) An insulating layer is formed on the silicon substrate 2, a conductive metallic film is formed on the insulating layer, a patterning process is performed, and then a wiring layer is formed. An insulating layer is formed to cover the wiring layer, and a CMP (Chemical Mechanical Polishing) technique is applied to smooth the surface of the insulating layer and the wiring layer, so that an interlayer insulating layer 14 is formed. By repeating the above processes, the wiring layer 12 and the wiring layer 13 may be formed.

(2) An insulating layer is formed on the silicon substrate 2, and a patterning process is performed to form trenches. A metallic plating film is formed on the insulating layer by plating, and a smoothing process may be repeated by applying the CMP technique to the metallic plating film for leaving the metallic film (wiring layer) only in the trenches.

In this case, vapor deposition methods such as an evaporation method, a spattering method, and a CVD method, or a plating method or the like may be applied as formation methods of a conductive metal film. Also, for forming insulating layers, the CVD method or a SOG (Spin-on Glass) method can be applied.

For patterning the conductive metal film and the insulating layer, for example, a photolithography technique and an etching technique can be applied.

The via electrodes 15 are formed, after via holes are formed in the interlayer insulating layer 14 by an etching technique, by filling conductive metal materials in the via holes.

As the etching method, there is no specific method. It is preferable to use anisotropic dry etching such as ion etching, because such an etching method can provide via holes with high aspect ratios.

For filling the conductive metallic material into the via holes, for example, vapor deposition methods such as the sputtering method and the CVD method, the plating method, or conductive paste filling method can be applied. Of the methods, the use of the plating method is preferable. In this way, the via electrodes having low resistance consisting of Cu or the like can be formed with a high deposition rate.

Figure 5C:
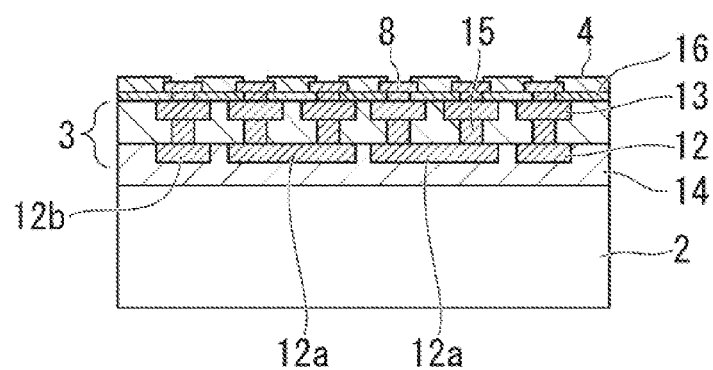

Next, a passivation layer 16, first UBM structures 8, and the encapsulant resin 4 are successively formed, as shown in FIG. 5C.

The passivation layer 16 is formed, after covering the interlayer insulating layer 14 and the second wiring layer 13 with the passivation film material by the CVD method, by selectively etching to remove the passivation film material at the regions corresponding to the openings.

Furthermore, the first UBM structures 8 can be formed by a known method. This can be performed, for example, by selectively forming metallic films on the second wiring layer 13 exposed from the passivation layer 16 by use of vapor deposition such as the sputtering method or the CVD method.

The encapsulant resin 4 can be formed, for example, by coating a solution of a resin or solution of a precursor of a resin on the surface of the multilayer wiring portion 3, curing it, and selectively removing the resin at the regions corresponding to the openings.

(1-2) Formation Process of Cavity Portions and Penetrating Holes

Figure 5D:
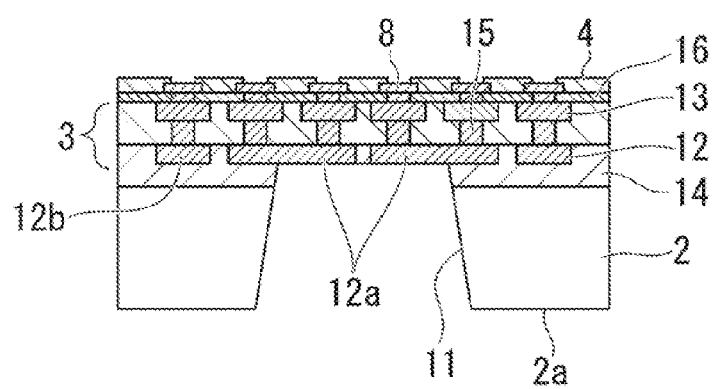

As shown in FIG. 5D, a cavity portion 11 is formed through the silicon substrate 2 and the interlayer insulating layer 14.

For forming the cavity 11, a resist mask having an opening at the region corresponding to the cavity 11 is formed on the back surface 2a of the silicon substrate 2. Subsequently, an etching process is performed from the back surface 2a of the silicon substrate 2 through the resist mask until the pad portions 12a are exposed, and then the cavity 11 is completed.

As the etching method, a wet etching method is preferable because it can etch a relatively large area with a high etching rate. As for the etching solution for wet etching, tetra-methylammonium hydroxide, potassium hydroxide or the like can be used.

Figure 5E:
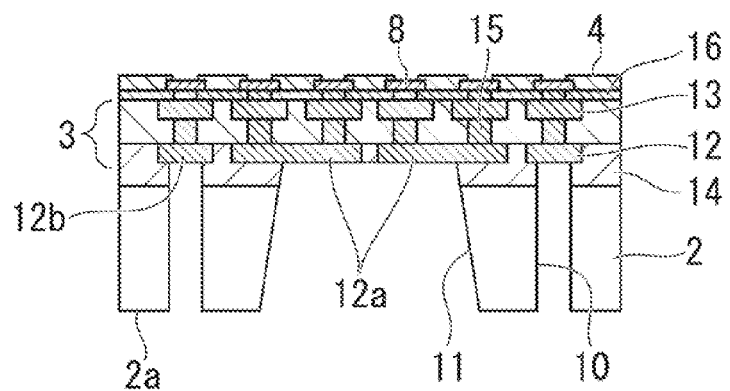

Next; the penetrating holes 10 are formed through the silicon substrate 2, as shown in FIG. 5E.

For forming the penetrating holes 10, a resist mask having openings at regions corresponding to the penetrating holes 10 is formed on the back surface 2a of the silicon substrate 2. Then, the penetrating holes 10 are formed by performing the etching process from the back surface 2a of the silicon substrate 2 through the resist mask until the wiring portions 12b of the first wiring layer 12 are exposed.

As the etching method, anisotropic dry etching such as ion etching is preferable because the penetrating holes 10 with a high aspect ratio can be formed.

(1-3) Formation Process of Underlying Layers (Thermal Oxide Film, Barrier Layer and Seed Layer)

Figure 5F:
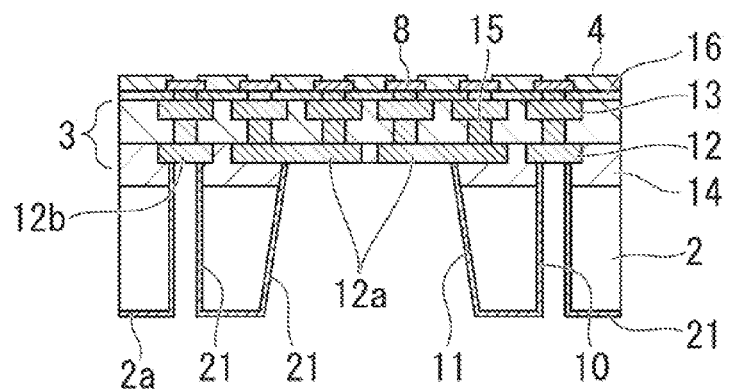

The underlying layers 21 (thermal oxide film, barrier layer and seed layer) are formed as shown in FIG. 5F.

A thermal oxide film ($SiO_2$ film) is formed on the back surface 2a of the silicon substrate 2, the cavity portion 11, and the inside side surfaces of the penetrating holes 10 by performing thermal oxidation of the silicon substrate 2.

Next, the barrier layer and the seed layer are successively formed on the thermal oxide film, so that the underlying layer 21 is formed. In this case, the seed layer is used as a plating electrode when the electrolytic plating is performed in the next process (1-4).

The barrier layer and the seed layer can be formed, for example, by use of the vapor deposition method such as the sputtering method and the CVD method.

(1-4) Formation Process of Penetrating Electrodes and Bump forming Portions

The penetrating electrodes 6 and the bump forming portions 5 are formed next.

The penetrating electrodes 6 and the conductive film 18a are formed by the electrolytic plating method first.

Figure 5G:
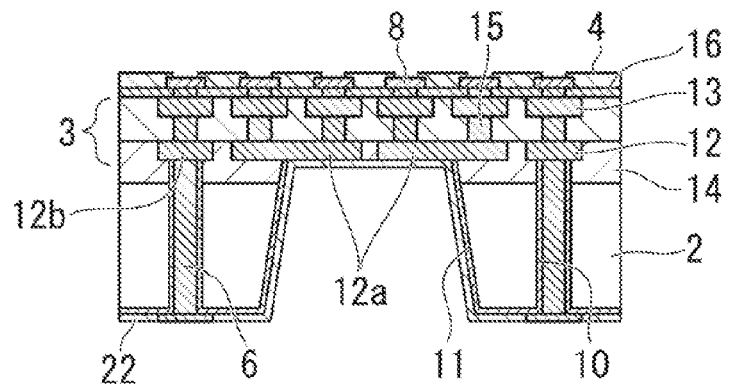

Specifically, the seed layer is used as the plating electrode. The electrolytic plating is performed until the penetrating holes 10 are filled with a metal plating film. As a result, as shown in FIG. 5G, cylindrical penetrating electrodes 6 are formed in the penetrating holes 10, and the metal plating film 22 is deposited on the back surface 2a of the silicon substrate 2 and the inside side surface of the cavity portion 11.

Figure 5H:
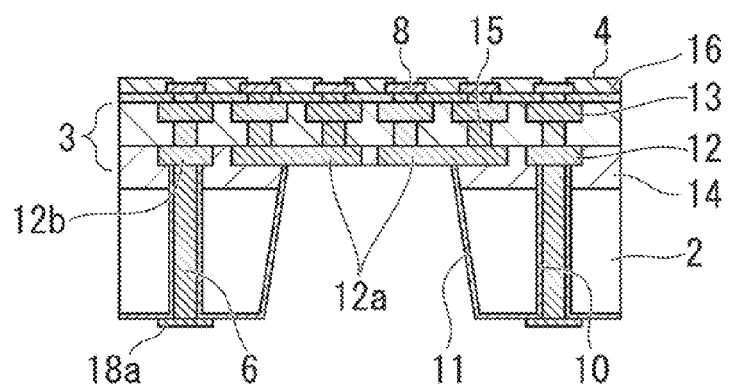

Next, the metal plating film 22 is patterned to a predetermined shape. In this way, as shown in FIG. 5H, the conductive films 18a are formed near the low ends of the penetrating electrodes 6, connecting to the penetrating electrodes 6.

As shown in FIG. 6, the insulating layer 19, the second UBM structures 20, and the bumps 9 are formed.

For forming the insulating layer 19, insulating films are formed to cover the conductive films 18a by the CVD method or the SOG method, and unused portions of the insulating films are selectively removed by an etching process. Then the insulating layer 19 is completed.

Furthermore, the second UBM structures 20 are formed by a similar method to that described above. For example, the bumps 9 are formed by melting solder balls on each of the second UBM structures 20.

(1-5) Mounting Process of Capacitors

Finally, the capacitor 7 is mounted in the cavity portion 11, and electrically connects the connection ends 7a of the capacitor 7 with the pad portions 12a of the first wiring layer 12.

Using the process above, the interposer 1 of FIG. 1 is obtained.

Furthermore, a description is given for another manufacturing process of the interposer in accordance with the first embodiment. In the explanation of the manufacturing method, the processes similar to those described above are omitted.

FIGS. 7A -7G illustrates the process sequence of another manufacturing method of the interposer in accordance with the present invention.

FIGS. 7A-7D are schematic diagrams that illustrate the longitudinal cross-section of-the penetrating holes and the penetrating electrodes during the formation process. FIGS. 7E-7G are schematic diagrams that illustrate the longitudinal cross-section of the cavity portions and the bump forming portions during the formation process.

(2-1) Formation Process of Multilayer Wiring portion and Encapsulant Resin

Similar to the formation process (1-1) in accordance with the first embodiment, the multilayer wiring portion 3, the first UBM structures 8, and the encapsulant resin are formed.

Figure 7A:
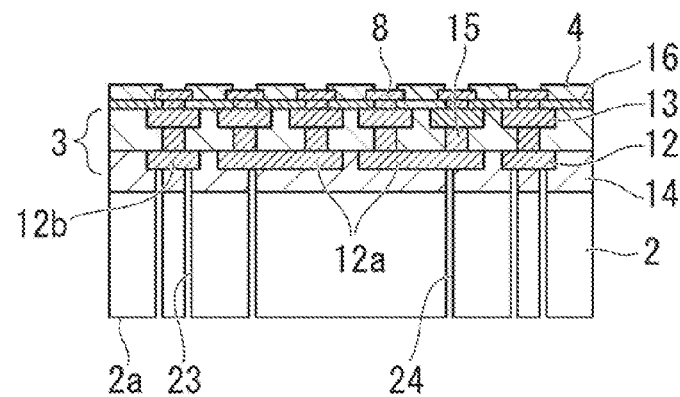
FIGS. 7A-7G are schematic diagrams that illustrate a longitudinal cross-section of the interposer, in which a sequential formation process of underlying layers, penetrating electrodes, cavity portions and bump forming portions is shown.

(2-2) Formation Process of Penetrating Holes, Penetrating Electrodes, and Cavity Portions Next, as shown in FIG. 7A, ring shaped narrow trenches 23 having roughly the same outside diameter as each of the penetrating holes 10 are formed at regions respectively corresponding to each of the penetrating holes 10. Narrow trenches 24 having shapes along each of the cavity portions 11 are formed at regions corresponding to the cavity portions 11.

For forming each of the narrow trenches 23 and 24, a resist mask having openings corresponding to each of the narrow trenches 23 and 24 is formed on the back surface 2a of the silicon substrate 2, and an etching process is performed from the surface 2a of the silicon substrate 2 until the wiring portions 12b of the first wiring layer 12 and the pad portions 12a are exposed. Then the narrow trenches 23 and 24 are completed.

As the etching method, anisotropic dry etching such as ion etching or the like is preferable because narrow trenches with high aspect ratio can be formed.

Figure 7B:
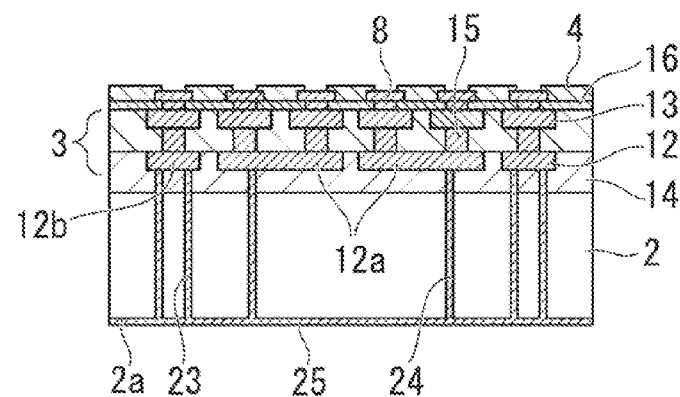

Next, as.shown in FIG. 7B, a resin film 25 is formed on the back surface 2a of the silicon substrate 2 and the inside of the narrow trenches 23 and 24 by curing the resin provided on the back surface 2a of the silicon substrate 2 and the inside of the narrow trenches 23 and 24.

As the resin, a BCB-based resin, polyimide-based resin, epoxy-based resin or the like can be applied.

Figure 7C:
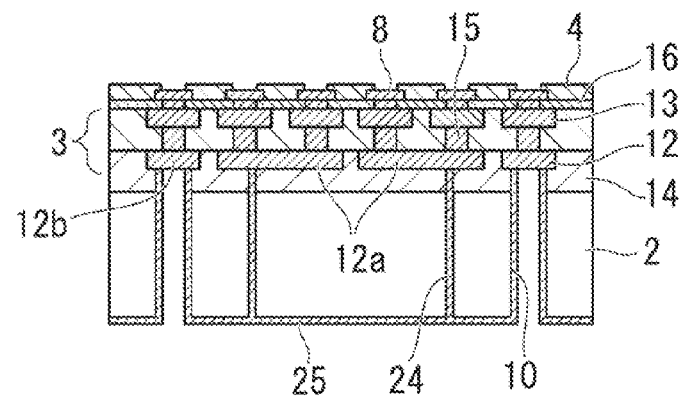

Subsequently, a photo resist mask (resist mask) having openings at regions respectively corresponding to the inside (center region in the figure) of the ring shaped narrow trenches 23 is formed on the resin film 25 of the back surface 2a of the silicon substrate 2. And, after removing the resin film 25 at the center region through the photo resist mask, ion etching is applied to the silicon at the center region. As a result, cylindrical shaped penetrating holes 10 having the resin films inside of the holes are obtained, as shown in FIG. 7C.

Next, a barrier layer and a seed layer, both of which are not indicated in the figure, are sequentially formed on the back surface 2a of the silicon substrate 2 and the resin layer 25 inside of the penetrating holes 10.

And the penetrating electrodes 6 are formed by electrolytic plating.

Figure 7D:
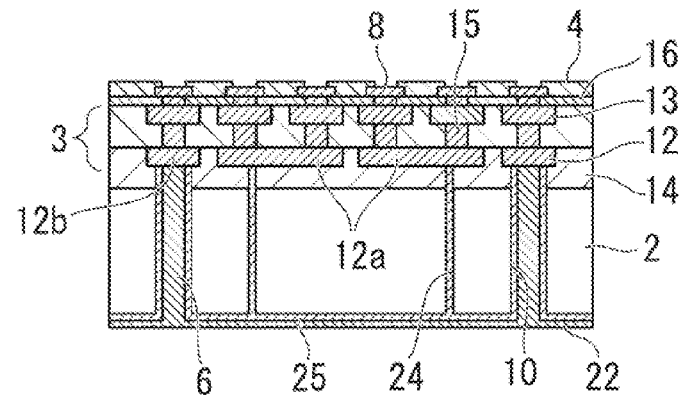
Figure 7E:
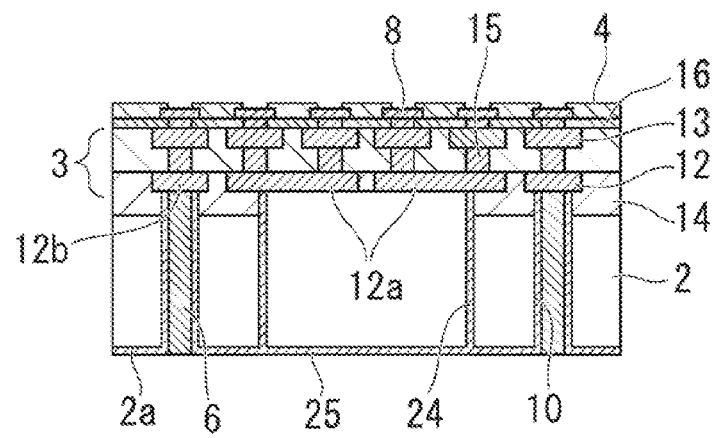
Figure 7F:
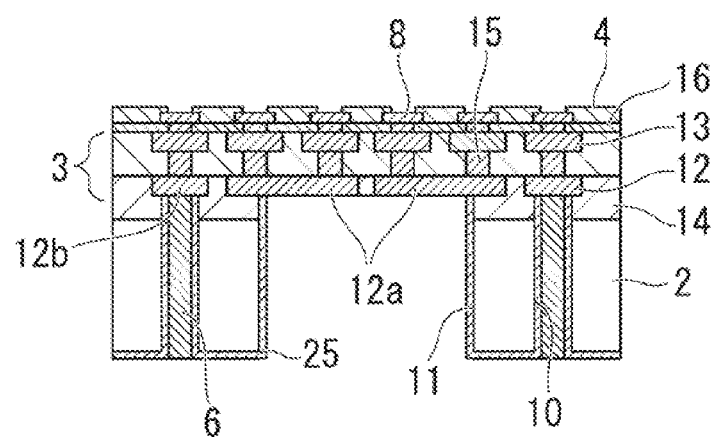
Figure 7G:
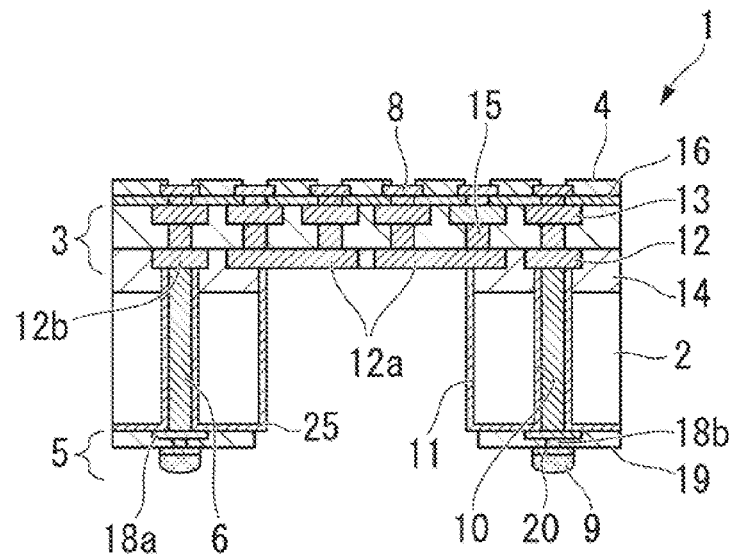

Specifically, the seed layer is used as a plating electrode, and the electrolytic plating is performed until the penetrating holes 10 are filled with the metal plating film. As a result, as shown in FIG. 7D, the penetrating electrodes 6 are formed cylindrically in the penetrating holes 10 and the metal plating film 22 is deposited on the back surface 2a of the silicon substrate 2.

Next; as shown in FIG. 7E, the metal plating film 22 deposited on the back surface 2a of the silicon substrate 2 is removed by grinding the film 22 using the CMP method.

A resist mask having openings at regions respectively corresponding to the cavity portions 11 is formed on the back surface 2a of the silicon substrate 2, and an etching process is performed from the back surface 2a of the silicon substrate 2 through the resist mask so that the pad portions 12a of the first wiring layer 12 are exposed. As a result, as shown in FIG. 7F, the cavity portions 11 having the resin films 25 are formed in the inside surface (2-3) Formation Process of Bump Portions Next, the bump portions 5 are formed on the back surface 2a of the silicon substrate 2, as shown in FIG. 7G.

The conductive film 18a is formed by use of an electrolytic plating method.

Specifically, the seed layer formed on the back surface 2a of the silicon substrate 2 is used as a plating electrode. After a metallic film is deposited on the seed layer, a patterning process is performed to form a predetermined pattern. In this way, the conductive film 18a connected to the penetrating electrode 6 is formed near the lower end of the penetrating electrode 6.

Next, the insulating layer 19, the second UBM structures 20, and the bumps 9 are sequentially formed. Each of these is formed similarly to those described in the first embodiment.

Based on the formation processes above, the interposer in accordance with the first embodiment is obtained.

According to the present manufacturing method, a Cu film is not deposited on the cavity portions in the penetrating electrode formation process. Especially, the wet etching process used for forming the cavity portions 11 in the process (2-2) can perform selective etching of silicon at a highly selective ratio in terms of the combination of silicon and epoxy resin. Thus, it is possible for the wet etching to etch the silicon substrate in the thickness direction of the silicon along the resin film. Therefore, the wet etching can form the cavity portions 11 with better shapes compared to use of an ion etching method for silicon material such as the Bosch process.

(Second Embodiment)

Next, a description will be given of an interposer in accordance with the second embodiment.

In the description of the second embodiment, explanations of the configurations similar to those of the first embodiment are omitted.

Figure 8:
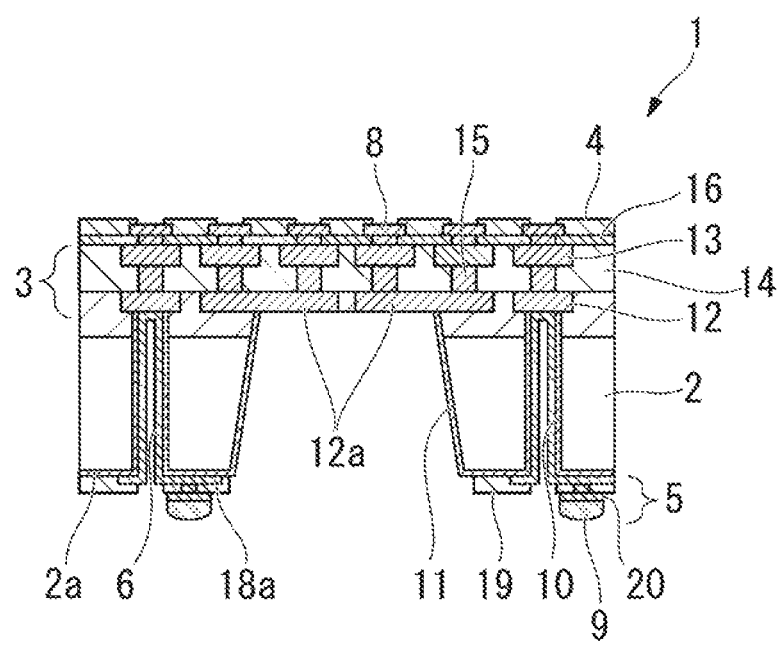
FIG. 8 is a schematic diagram that illustrates a longitudinal cross-section of the interposer in accordance with a second embodiment.

FIG. 8 is a schematic diagram that illustrates a longitudinal cross-section of the interposer in accordance with the second embodiment of the present invention.

The interposer 1 in accordance with the second embodiment is formed similarly to that of the first embodiment except for the shapes of the penetrating electrodes 6 and the conductive film 18*a*.

For the interposer 1, the penetrating electrode 6 is formed by depositing a metal plating film on the inside surface of the penetrating holes 10 with a predetermined thickness, having a ring shape. The conductive film 18*a* is formed successively from the penetrating electrode 6 at a position close to the end portion of the penetrating electrode 6 of the back surface 2*a* of the silicon substrate 2.

In the second embodiment, the same effects as those of the first embodiment can be obtained.

Furthermore, in the second embodiment, especially, as the penetrating electrode has a ring shape, the deposition time to form the metal plating film on the penetrating electrode 6 can be reduced compared to a case when the metal plating film is filled in the penetrating hole 10. Thereby, the manufacturing efficiency of the interposer 1 can be improved.

(Third Embodiment)

Next, a description is given of an interposer 1 in accordance with the third embodiment.

In the third embodiment, the explanations of the configurations identical to those of the first embodiment are omitted.

Figure 9:
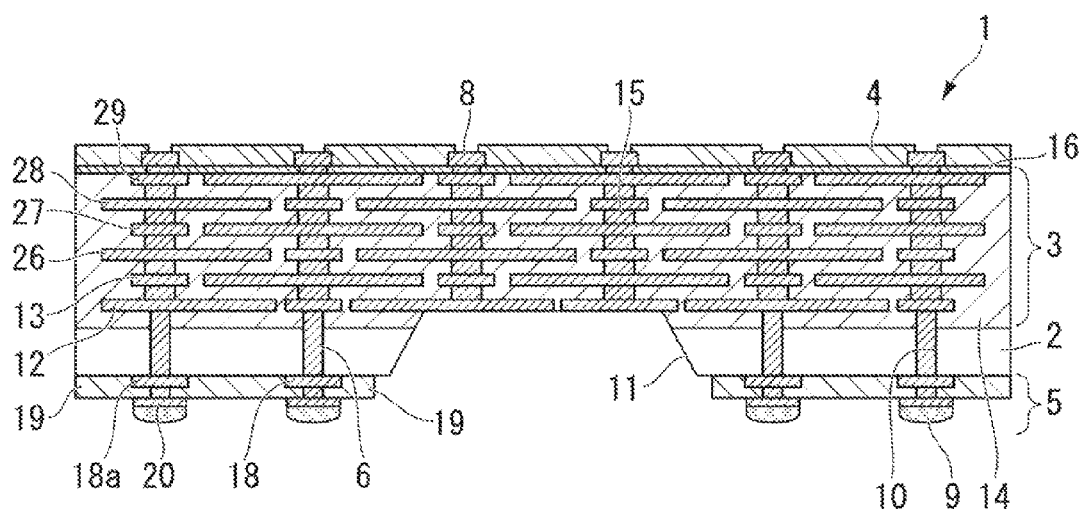
FIG. 9 is a schematic diagram that illustrates a longitudinal cross-section of the interposer in accordance with a third embodiment.

FIG. 9 is a schematic diagram that illustrates a longitudinal cross-section of the interposer 1 in accordance with the third embodiment.

The interposer 1 in accordance with the third embodiment is configured to have a multiple layer wiring portion 3 that includes six wiring layers consisting of the first wiring layer 12 through the sixth wiring layer 29. The interposer 1 is configured to have the electronic part 30 in which the ground pins are connected to each of the wiring layers 12, 13, 26, 27, 28, and 29 when being mounted on the interposer 1. The configurations of the third embodiment except for the multiple layer wiring portion 3 and the electronic part 30 are similar to those of the first embodiment.

Based on the third embodiment, the same effects as those of the first embodiment can be obtained.

Furthermore, in the third embodiment, especially, the wiring layers (first wiring 12, third wiring 26, and the wiring layer 29) connected to the ground pin function as a ground layer. The wiring layers (second wiring layer 13, fourth wiring layer 27, and the sixth wiring layer 26) connected to the power supply pin function as a power supply layer. Each of combinations of the ground layer, the interlayer insulating layer, and the power supply layer functions as a capacitor.

Thereby, electronic noise of the electronic part 30 can be reduced effectively.

(Fourth Embodiment)

Next, a description will be given of an interposer in accordance with the fourth embodiment.

In the fourth embodiment, explanations of configurations identical to those of the third embodiment are omitted.

Figure 10:
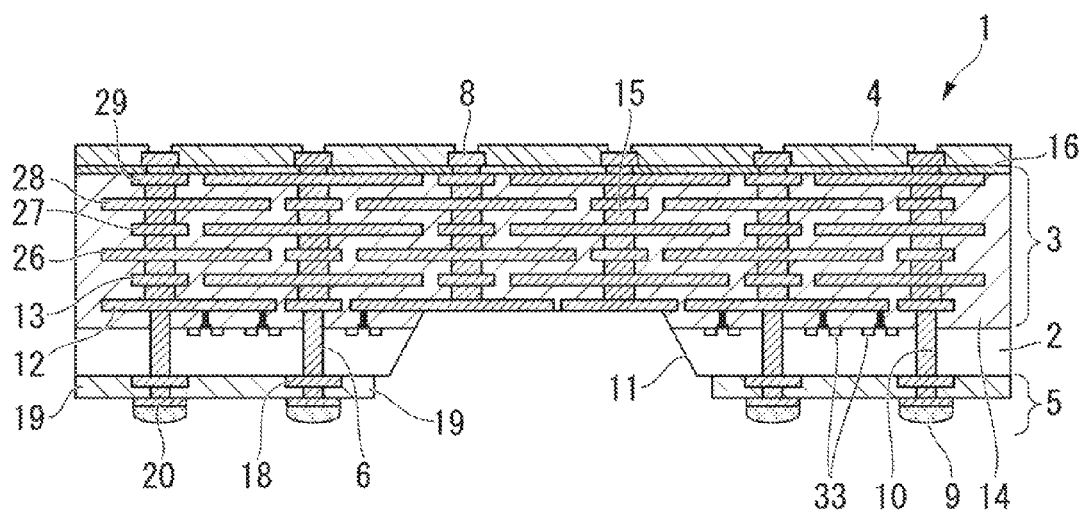
FIG. 10 is a schematic diagram that illustrates a longitudinal cross-section of the interposer in accordance with a fourth embodiment.

FIG. 10 is a schematic diagram that illustrates a longitudinal cross-section of the interposer 1 in accordance with the fourth embodiment.

For the interposer 1 in accordance with the fourth embodiment, multiple transistors 33 are formed on the silicon substrate 2. Under a state where the electronic part 30 is mounted on the interposer 1, the gate electrode and the source and drain electrodes of each of the transistors 33 are respectively connected to the power supply pin and the ground pins of the electronic part 30. The interposer 1 of the fourth embodiment except for the features of the multiple transistors 33 and connections of the electrodes of the multiple transistors 33 with the power supply pin and the ground pins is configured to be similar to that of the third embodiment.

Based on the fourth embodiment, the same effects as those of the third embodiment can be obtained.

Furthermore, according to the fourth embodiment, the plural transistors 33 are formed on the silicon substrate 2. Each of the gate electrodes of the transistors 33 is connected to the power supply pin of the electronic part 30, and each of the source electrode and the drainelectrode is connected to the ground pin. As each of the electrodes is connected to the wiring portion 12*b*, the gate capacitance functions as a capacitor. Thereby, the power source noise of the electronic pan 30 can be reduced effectively.

(Semiconductor Device)

Next, a description will be given of a semiconductor device (a semiconductor device of the present invention) that utilizes the interposer in accordance with the present invention.

Figure 11:
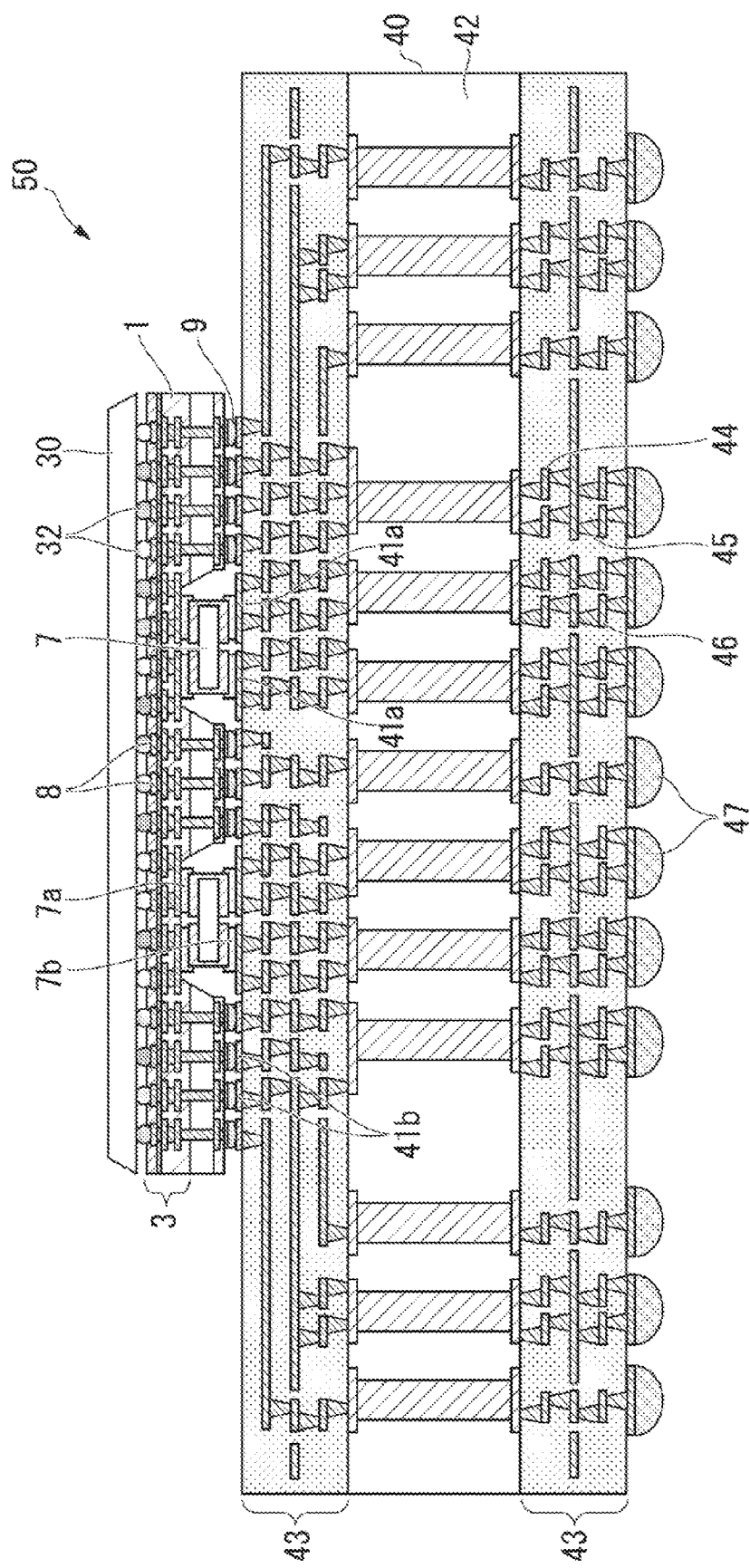
FIG. 11 is a schematic diagram that illustrates a longitudinal cross-section of a semiconductor device in accordance with an embodiment of the present invention.
Figure 12:
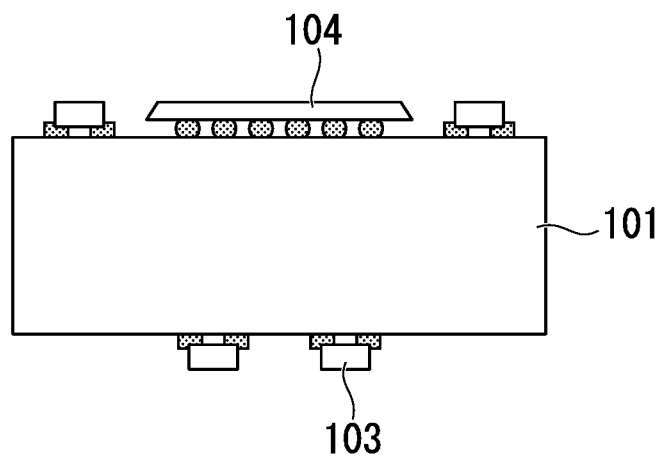
FIG. 12 is a schematic diagram that illustrates a related interposer.
Figure 13:
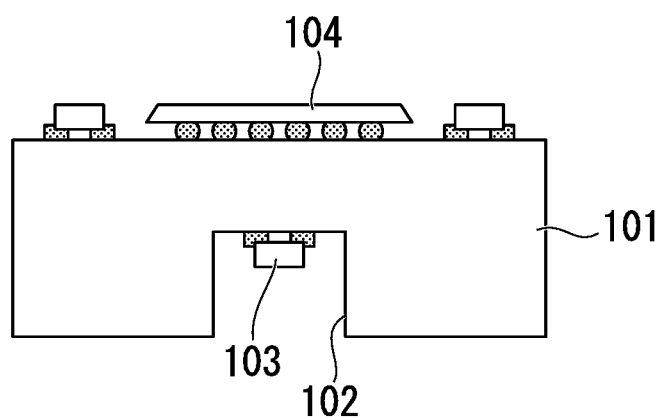
FIG. 13 is a schematic diagram that illustrates another example of a related interposer.

FIG. 11 is a schematic diagram that illustrates a longitudinal cross-section of a semiconductor device 50 in accordance with an embodiment of the present invention.

The semiconductor device 50 of FIG. 11 includes an interposer 1, an electronic part (mounting electronic part) 30 mounted on the interposer 1, and a buildup substrate (wiring substrate) 40 on which the interposer 1 is mounted.

The interposer 1 can be configured by a similar structure to that described in the above embodiments.

The electronic part 30 includes multiple connection portions 31 at the back surface of the electronic part 30, and the multiple connection portions 31 are connected to each of the first UBM structures 8, so that the electronic part 30 is mounted on the interposer 1.

For the interposer 1 mounted by the electronic part 30, the capacitors 7 are disposed in the cavity portion 10 and electrically connected to the ground pins and the power supply pins of the electronic part 30 via each of portions of the multilayer wiring portion 3.

The wiring substrate 40 includes a substrate 42 and multilayer wiring portions 43 disposed on both sides f the substrate 42. Each of the multilayer wiring portions 43 includes three wiring layers 44, 45, and 46. One side of the multilayer wiring portions 43 includes multiple pad portions 41*a* and 41*b*, which are electrically connected to the wiring layers 44, 45, and 46, respectively. Furthermore, the other side of the multilayer wiring portions 43 includes multiple bumps 47, which are electrically connected to the wiring layers 44, 45 and 46, respectively.

The bumps 9 of the interposer 1 are respectively connected to the pad portions 41*b*, and the connecting terminals 7*b* are respectively connected to pad portions 41a of the wiring substrate 40. In this way, the interposer 1 is mounted on the wiring substrate 40.

The semiconductor device 50 can effectively reduce the power supply noise generated from the electronic part 30 by the capacitors 7 mounted on the interposer 1, regardless of the frequency range of the noise.

As the connection terminals 7b of the capacitors 7 are electrically connected to the pad portions 41a of the wiring substrate 40, each of the wiring layers of the wiring substrate 40 can be used as power supply paths, so that sufficient power supply can be achieved. Thereby, the semiconductor device in accordance with the present embodiment can perform stable operation.

Although descriptions have been given for the interposer and the semiconductor device including the interposer in accordance with the present invention, respective components used in the interposer and the semiconductor device are shown only as an example. Variations of the components can be made within the scope of the present invention.

For example, in each of the embodiments described above, although the capacitors are used as the mounting electronic part mounted in the cavity portions of the interposer, the mounting electronic part is not limited to the capacitors. For example, when a resistor part issued as the mounting electronic part, the transmission characteristics of a series termination circuit are improved because the resistor part is disposed near the mounting electronic part.

In the embodiment of the semiconductor device above, although the interposer used in the first embodiment is applied to the semiconductor device, the interposer to be used for the semiconductor device may be any one of the interposers according to the first embodiment through the fourth embodiment. Furthermore, the wiring substrate is not limited to the buildup substrate. For example, other substrates such as a ceramic substrate and the like may be used as the wiring substrate.

What is claimed is:
1. An interposer, comprising:
a silicon substrate including a plurality of penetrating electrodes;
a wiring portion formed on the silicon substrate, the wiring portion including a wiring layer electrically connected to the penetrating electrodes and an insulating layer covering the wiring layer;
a plurality of first UBM structures provided at a side of the wiring portion opposite the silicon substrate, the first UBM structures being electrically connected to the wiring layer; and
a plurality of bumps provided at a side of the silicon substrate opposite the wiring portion, the plurality of bumps being electrically connected to each of the penetrating electrodes via a plurality of second UBM structures,
wherein the first UBM structures are connected to connecting portions of a mounting electronic part to mount the mounting electronic part, and each of the bumps is connected to electrode pads of a wiring substrate so that the interposer is mounted on the wiring substrate,
a cavity portion tapering toward the wiring layer is formed to provide an opening at a surface of the silicon substrate opposite to the wiring portion, the cavity portion is formed by the silicon substrate and a via-hole that continuously penetrates the silicon substrate and the insulating layer positioned between the silicon substrate and the wiring layer, and the wiring layer is exposed at a bottom of the cavity portion, and the wiring layer includes pad portions at an exposed portion of the bottom of the cavity portion so that the pad portions are connected to the mounting electronic part.

2. The interposer according to claim 1,
wherein the interposer includes the mounting electronic part mounted in the cavity portion, and connecting terminals of the mounting electronic part are electrically connected to the pad portions of the wiring layer.

3. The interposer according to claim 1,
wherein the mounting electronic part corresponds to at least one of a capacitor and a resistor part.

4. The interposer according to claim 3,
wherein the mounting electronic part includes connecting terminals that are connected to the electrode pads of the wiring substrate.

5. The interposer according to claim 4,
wherein the wiring portion includes a plurality of wiring layers being multilayered with the insulating layer, and each of the wiring layers is connected alternately and electrically to a power supply connecting portion and a ground connecting portion of the mounting electronic part in a state where each of the connecting portions of the mounting electronic part is connected to the first UBM structures.

6. The interposer according to claim 5, wherein the substrate is provided with a transistor, a gate electrode of the transistor is electrically connected to the power supply connecting portion of the mounting electronic part and a source electrode and a drain electrode of the transistor are electrically connected to the ground connecting portion of the mounting electronic part in a state where each of the connecting portions of the mounting electronic part is connected to the first UBM structures.

7. A semiconductor device comprising:
an electronic part;
a wiring substrate; and
an interposer that includes
a silicon substrate including a plurality of penetrating electrodes,
a wiring portion formed on the silicon substrate, the wiring portion including a wiring layer electrically connected to the penetrating electrodes and an insulating layer covering the wiring layer,
a plurality of first UBM structures provided at a side of the wiring portion opposite the silicon substrate, the first UBM structures being electrically connected to the wiring layer, and
a plurality of bumps provided at a side of the silicon substrate opposite the wiring portion, the plurality of bumps being electrically connected to each of the penetrating electrodes via a plurality of second UBM structures,
wherein the first UBM structures are connected to connecting portions of a mounting electronic part to mount the mounting electronic part, and each of the bumps is connected to electrode pads of a wiring substrate so that the interposer is mounted on the wiring substrate,
a cavity portion tapering toward the wiring layer is formed to provide an opening at a surface of the silicon substrate opposite to the wiring portion, the cavity portion is formed by the silicon substrate and a via-hole that continuously penetrates the silicon substrate and the insulating layer positioned between the silicon substrate and the wiring layer, and the wiring layer is exposed at a bottom of the cavity portion, and the wiring layer includes pad portions at an exposed portion of the bottom of the cavity portion so that the pad portions are connected to the mounting electronic part.

8. The semiconductor device according to claim 7, wherein the interposer is disposed in the cavity portion and includes the mounting electronic part connected to the pad portions of the wiring layer, and the mounting electronic part is connected to the electrode pads of the wiring substrate.

* * * * *